(12) United States Patent
Osterwald et al.

(10) Patent No.: US 10,483,229 B2
(45) Date of Patent: Nov. 19, 2019

(54) SINTERING DEVICE

(71) Applicant: DANFOSS SILICON POWER GMBH, Flensburg (DE)

(72) Inventors: Frank Osterwald, Kiel (DE); Ronald Eisele, Surendorf (DE); Martin Becker, Kiel (DE); Lars Paulsen, Hollingstedt (DE); Jacek Rudzki, Kiel (DE); Holger Ulrich, Eisendorf (DE)

(73) Assignee: Danfoss Silicon Power GmbH, Flensburg (DE)

( * ) Notice: Subject to any disclaimer, the term of this patent is extended or adjusted under 35 U.S.C. 154(b) by 257 days.

(21) Appl. No.: 15/514,548

(22) PCT Filed: Sep. 9, 2015

(86) PCT No.: PCT/EP2015/070617
§ 371 (c)(1),
(2) Date: Mar. 27, 2017

(87) PCT Pub. No.: WO2016/050466
PCT Pub. Date: Apr. 7, 2016

(65) Prior Publication Data
US 2017/0229418 A1  Aug. 10, 2017

(30) Foreign Application Priority Data
Sep. 29, 2014  (DE) .................. 10 2014 114 095

(51) Int. Cl.
*H01L 23/00* (2006.01)
*B22F 3/14* (2006.01)
*B22F 5/00* (2006.01)

(52) U.S. Cl.
CPC .............. *H01L 24/75* (2013.01); *B22F 3/14* (2013.01); *B22F 5/00* (2013.01); *H01L 24/83* (2013.01);
(Continued)

(58) Field of Classification Search
CPC ............................... H01L 24/75; H01L 24/83
See application file for complete search history.

(56) References Cited

U.S. PATENT DOCUMENTS

| | | | |
|---|---|---|---|
| 3,480,842 A | 11/1969 | Scharli | |
| 3,529,759 A | 9/1970 | Clark | |

(Continued)

FOREIGN PATENT DOCUMENTS

| | | |
|---|---|---|
| CN | 1462067 A | 12/2003 |
| CN | 1823409 A | 8/2006 |

(Continued)

OTHER PUBLICATIONS

International Search Report for PCT Serial No. PCT/EP2015/070617 dated Dec. 10, 2015.

(Continued)

*Primary Examiner* — Scott R Kastler
(74) *Attorney, Agent, or Firm* — McCormick, Paulding & Huber LLP

(57) ABSTRACT

Sintering device for sintering at least one electronic assembly, having a lower die and an upper die which is slidable towards the lower die, or a lower die which is slidable towards the upper die. The lower die forms a support for the assembly to be sintered and the upper die includes a receptacle for a pressure pad for exerting pressure directed towards the lower die, and a delimitation wall which laterally surrounds the pressure pad. The delimitation wall having an outer delimitation wall and an inner delimitation wall surrounded by the outer delimitation wall, the inner delimitation wall mounted so as to be slidable towards the outer delimitation wall and so as to be slid in the direction of the lower die such that, following the placing of the inner delimitation wall on the lower die, the pressure pad is displaceable in the direction of the lower die.

20 Claims, 3 Drawing Sheets

(52) U.S. Cl.
CPC . *B22F 2998/10* (2013.01); *H01L 2224/32225* (2013.01); *H01L 2224/7531* (2013.01); *H01L 2224/7532* (2013.01); *H01L 2224/7598* (2013.01); *H01L 2224/75251* (2013.01); *H01L 2224/75252* (2013.01); *H01L 2224/75315* (2013.01); *H01L 2224/75316* (2013.01); *H01L 2224/75317* (2013.01); *H01L 2224/75318* (2013.01); *H01L 2224/75704* (2013.01); *H01L 2224/75821* (2013.01); *H01L 2224/75824* (2013.01); *H01L 2224/8384* (2013.01); *H01L 2224/83203* (2013.01); *H01L 2224/83209* (2013.01)

(56) References Cited

U.S. PATENT DOCUMENTS

| | | | |
|---|---|---|---|
| 4,257,156 A | 3/1981 | Houston | |
| 4,340,902 A | 7/1982 | Honda et al. | |
| 4,392,153 A | 7/1983 | Glascock, II et al. | |
| 4,591,537 A | 5/1986 | Aldinger et al. | |
| 4,903,885 A | 2/1990 | Schwarzbauer | |
| 4,903,886 A | 2/1990 | Schwarzbauer | |
| 5,213,248 A | 5/1993 | Horton et al. | |
| 5,247,425 A | 9/1993 | Takahasi | |
| 5,352,629 A | 10/1994 | Paik et al. | |
| 5,653,376 A | 8/1997 | Nakamura et al. | |
| 6,108,205 A | 8/2000 | Bergstedt | |
| 6,199,748 B1 | 3/2001 | Zhu et al. | |
| 6,821,381 B1 | 11/2004 | Yamauchi et al. | |
| 2001/0005053 A1 | 6/2001 | Kitae et al. | |
| 2003/0027371 A1 | 2/2003 | Sunagawa et al. | |
| 2004/0063251 A1 | 4/2004 | Ootsuka et al. | |
| 2004/0157362 A1 | 8/2004 | Beroz et al. | |
| 2006/0186423 A1 | 8/2006 | Blonder et al. | |
| 2006/0210705 A1 | 9/2006 | Itoh et al. | |
| 2007/0131353 A1 | 6/2007 | Gobl | |
| 2008/0073776 A1 | 3/2008 | Suh et al. | |
| 2008/0156398 A1 | 7/2008 | Yasuda et al. | |
| 2009/0032570 A1 | 2/2009 | Matsumura | |
| 2009/0039507 A1 | 2/2009 | Funaki | |
| 2010/0051319 A1 | 3/2010 | Schmitt et al. | |
| 2010/0055828 A1 | 3/2010 | Schmitt et al. | |
| 2010/0093131 A1 | 4/2010 | Maeda | |
| 2011/0114708 A1 | 5/2011 | Maeda et al. | |
| 2011/0290863 A1 | 12/2011 | Kajiwara et al. | |
| 2012/0052402 A1 | 3/2012 | Turek et al. | |
| 2012/0153011 A1 | 6/2012 | Schäfer et al. | |
| 2012/0247664 A1 | 10/2012 | Kobayashi | |
| 2013/0092310 A1 | 4/2013 | Ishigami et al. | |
| 2013/0271248 A1 | 10/2013 | Nagata et al. | |
| 2015/0037197 A1 | 2/2015 | Komatsu | |
| 2015/0077895 A1 | 3/2015 | Jindo et al. | |
| 2016/0059361 A1 | 3/2016 | Schäfer et al. | |
| 2016/0190046 A1 | 6/2016 | Fontana | |
| 2017/0141074 A1 | 5/2017 | Schäfer et al. | |
| 2017/0229418 A1* | 8/2017 | Osterwald | H01L 24/75 |
| 2017/0326640 A1 | 11/2017 | Schmitt et al. | |

FOREIGN PATENT DOCUMENTS

| | | |
|---|---|---|
| CN | 101111932 A | 1/2008 |
| CN | 101371346 A | 2/2009 |
| CN | 101490831 A | 7/2009 |
| CN | 102709203 A | 10/2012 |
| CN | 102569110 B | 6/2014 |
| DE | 102007047698 A1 | 4/2008 |
| DE | 10 2008 009 510 B3 | 7/2009 |
| DE | 102008048869 A1 | 4/2010 |
| DE | 10 2010 020 696 A1 | 11/2011 |
| DE | 10 2010 020 696 B4 | 11/2012 |
| DE | 10 2013 003 527 A1 | 9/2014 |
| EP | 2 278 032 A2 | 1/2011 |
| JP | 64-005026 | 1/1989 |
| JP | 2003-347360 A | 12/2003 |
| JP | 2004-296746 A | 10/2004 |
| JP | 2006-352080 A | 12/2006 |
| KR | 2012-0090202 A | 8/2012 |
| WO | 2014/003107 A1 | 1/2014 |
| WO | 2014/129626 A1 | 8/2014 |
| WO | 2014/135151 A2 | 9/2014 |

OTHER PUBLICATIONS

"Die Niedertemperatur-Verbindungstechnik der Leistungselektronik" by Christian Mertens (Jan. 1, 2004), Book series: Fortschritt-Berichte VD1, Reihe 21, Elektrotechnik, No. 365, VDI Verlag, Düsseldorf, Germany, pp. 1-35, 72-101, 116-141; and English translation of pertinent parts thereof.

"Reduction of Thermomechanical Stress by Applying a Low Temperature Joining Technique" by S. Klaka et al, Proceedings of the International Symposium on Power Semiconductor Devices (May 31-Jun. 2, 1994), Davos, Switzerland, pp. 259-264.

* cited by examiner

SINTERING DEVICE

CROSS-REFERENCE TO RELATED APPLICATIONS

This application is a National Stage application of International Patent Application No. PCT/EP2015/070617, filed on Sep. 9, 2015, which claims priority to German Patent Application No. 102014114095.8, filed on Sep. 29, 2014, each of which is hereby incorporated by reference in its entirety.

TECHNICAL FIELD

The invention relates to a sintering device for sintering an electronic assembly, having a lower die and an upper die which is slidable towards the lower die, wherein the lower die forms a support for the assembly to be sintered and the upper die comprises a receptacle which receives a pressure pad for exerting pressure directed towards the lower die and which has a delimitation wall which laterally surrounds the pressure pad.

BACKGROUND

Sintering devices for performing low-temperature pressure sintering of electronic assemblies are already known. Such sintering devices comprise, for example, a sintering chamber which may be filled with a gas which particularly facilitates the sintering operation or a corresponding gas mixture, and an upper die disposed in the sintering chamber and a lower die, the upper die and the lower die being slidable towards one another and preferably each having a dedicated heating unit.

Sintering of the electronic assembly itself takes place by temperature-controlling the assemblies to be sintered and by applying pressure imparted by the dies. In this manner, the temperature required for the connection and diffusion in the case of low-temperature pressure sintering, using silver (Ag), is typically between 130° C. and 250° C. to 300° C., for example, and, at a pressure up to 30 MPa, requires a time duration of around 5 to 10 min.

In sintering, the diffusion process is facilitated, in particular, by silver layers having a large surface between the joining parts, by using either initially fine particles (5 nm to 20 µm) in the form of pasty layers or pre-processed Ag platelets. In order for a particularly shear-resilient and fine closed-porous layer to be created, the joining layer, prior to and during the diffusion process, is compacted by pressure. After the diffusion process subsides, the pressure and the temperature are reduced.

As a result of such a sintering process, a shear-resilient and materially integral connection which electrically and thermally connects the components, e.g. a transistor, with the substrate of the electronic assembly is obtained, wherein the assembly thus processed may be removed from the sintering device after pressure and temperature have been lowered and the dies have been opened.

It is a problem when using pressure pads that these pads, on account of heavy deforming work on the components, sometimes create edge damage. Therefore, it is already known from DE 10 2010 020 696 B4 to mould a pressure pad having a contour which, as a negative, corresponds to the assembly to be sintered.

In turn it is disadvantageous in a pressure pad contoured in such a manner that, while enclosure of the assembly to be sintered is indeed possible, lateral deflection of the pressure pad when high pressures are applied which damage to the assembly cannot be completely avoided.

SUMMARY

It is, therefore, the object of the invention to provide a sintering device which permits performing a robust method of sintering, in particular the sintering of electronic assemblies, without the problem of lateral deflection of the pressure pad and the shortcomings associated therewith.

This object is achieved according to the invention by the sintering device for sintering at least one electronic assembly (BG), having a lower die and an upper die which is slidable towards the lower die, or a lower die which is slidable towards the upper die, wherein the lower die forms a support for the assembly (BG) to be sintered and the upper die comprises a receptacle which receives a pressure pad for exerting pressure directed towards the lower die and which comprises a delimitation wall which laterally surrounds the pressure pad, and wherein the delimitation wall has an outer delimitation wall and an inner delimitation wall which is surrounded in an adjacent manner by the outer delimitation wall, and wherein the inner delimitation wall is mounted so as to be slidable towards the outer delimitation wall and, when pressure in the direction of the upper die is exerted on the pressure pad, is mounted so as to be slid in the direction of the lower die, whereby, following the placing of the inner delimitation wall on the lower die, the pressure pad is displaceable in the direction of the lower die.

According to the invention, the sintering device for sintering at least one electronic assembly comprises a lower die and an upper die which is slidable towards the lower die, or an upper die and a lower die which is slidable towards the upper die, wherein the lower die forms a support for the assembly to be sintered and the upper die comprises a receptacle in which a pressure pad for exerting pressure directed towards the lower die is disposed. The delimitation wall surrounding the pressure pad here comprises an outer delimitation wall and an inner delimitation wall which is surrounded by the outer delimitation wall, wherein the inner delimitation wall is mounted so as to be slidable towards the outer delimitation wall and, when pressure in the direction of the upper die is exerted on the pressure pad, is mounted so as to be slid in the direction of the lower die. Following the placing of the inner delimitation wall on the lower die, the pressure pad is displaced in the direction of the lower die. This is effected in that the inner delimitation wall which is vertically movable is pressed by the lower die in the direction of the upper die, thus displacing the pressure pad. A plurality of assemblies to be sintered may be disposed on a workpiece carrier, wherein instead of a single assembly a workpiece carrier which carries a plurality of assemblies may be introduced for pressure sintering between the upper die and the lower die.

The device is thus configured such that, on account of being subsequently displaced onto the inner delimitation wall, pressure acting in the direction of the upper die on the pressure pad is deflected in such a manner that said inner delimitation wall slides in the direction of the lower die. It is thus achieved by this arrangement, much in the manner of self-locking, that the inner delimitation wall lies tightly against the lower die, without even the displacement forces of the pressure pad being able to be sufficient to push between the lower die and the inner delimitation wall and to lift the inner delimitation wall from the lower die.

The displacement forces created on account of the height contour of the assembly and the components are thus converted into a compression pressure. After bringing together the upper-die receptical and the lower-die face, the height contour of the assembly including the components and the stacked functional elements is entirely enclosed by the pressure pad material, and these are pressure-sintered in a quasi-hydraulic manner. If the inner delimitation wall in the direction of the lower die protrudes beyond the outer delimitation wall, the inner delimitation wall can contact the lower die and, in the case of pressure being further increased, is pressed in a horizontally sliding manner in the direction of the upper die and prevents lateral deflection of the pressure pad. The pressure pad, within a closed receptical volume, is circumferentially enclosed by the delimitation wall and the lower die having the assembly to be sintered. The volumetric change created by sliding the inner delimitation wall in the direction of the upper die compresses the pressure pad in the receptical volume which is bordered by the delimitation wall and the lower die, and forces the pressure pad in the direction of the assembly. On account thereof, a hydrostatic sintering pressure, which may be modified within arbitrary limits, is exerted on the assembly.

The inner delimitation wall may be formed from an oxidic, polymer or metallic material, for example. A useful property here is the generation of low breakaway forces, which requires a matching coefficient of expansion between the upper-die receptical and the inner delimitation wall. This can be advantageously achieved with all metals: martensitic chromium steel, spring steel or ductile iron meet these requirements while at the same time offering contour accuracy at high temperatures.

In particular, the outer and the inner delimitation walls are preferably configured so as to be annular. The annular shape may be configured so as to be round; however, an elliptic, polygonal or rectangular annular shape is also conceivable, as are in particular annular shapes which are adapted in a shape-complementary manner to the outer contour of the assembly.

The assembly may be capable of sintering as a single component, or a combination of a plurality of assemblies may be disposed on a workpiece carrier, wherein the entire workpiece carrier may be sintered between the upper die and the lower die by means of one or more pressure pads. One, two or more pressure pads may be disposed here on the upper die, wherein, for example, one pressure pad having a delimitation wall may be assigned to each assembly, or a single pressure pad having a delimitation wall may be assigned to the workpiece carrier having a plurality of assemblies.

According to a preferred, particularly simple embodiment, in the event of movement of the inner delimitation wall in the direction of the upper die, the pressure pad itself serves as a counter bearing for the inner delimitation wall. To this end, the end of the inner delimitation wall that lies opposite the lower die bears on a part of the pressure pad which is adapted so as to communicate with that part of the pressure pad that is enclosed by the inner delimitation wall and which is preferably configured in one piece.

The inner delimitation wall is preferably disposed such that, at least in one position, it protrudes in the direction of the lower die, beyond the outer delimitation wall, and thus comes into contact with the lower die prior to the outer delimitation wall being able to come into contact with the lower die.

The pressure pad is preferably a silicone pad or a rubber pad, but may also be formed from any other non-porous elastomer. These materials are highly elastic at the temperatures of up to 300° C. which prevail during sintering and, on account of their extreme cross-linking, also do not display any plastic flow at the pressures and temperatures used.

Since the material used for the pressure pad has a thermal coefficient of expansion, this hydraulic material will expand as temperature increases and in this manner cause the sintering pressure to increase. Therefore, pressure regulation which absorbs the resulting sintering pressure as a sum pressure and, by means of modifying the distance between the upper-die receptical and the lower die, can compensate for said pressure, is recommended.

Furthermore, the lower die of the device may comprise a depression for receiving the assembly to be sintered or a workpiece carrier for a plurality of assemblies.

A protective film may be advantageously disposed between the assembly and the upper die. The protective film may preferably be a Teflon film (PTFE film). The protective film separates the assembly from the pressure pad and protects the assembly from contamination and adhesion, for example by material abrasion, in particular silicone abrasion of the pressure pad.

BRIEF DESCRIPTION OF THE DRAWINGS

The invention will be explained in more detail by means of an exemplary embodiment which is illustrated in the appended drawings. In the drawings.

DETAILED DESCRIPTION

Figure 1:
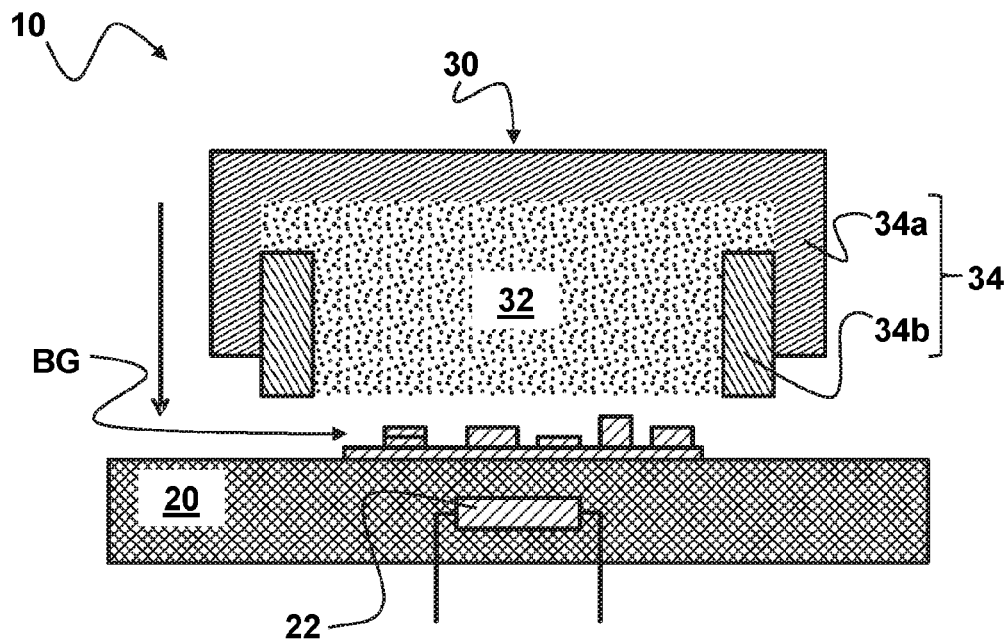
FIG. 1 shows a sectional view through a particularly preferably designed exemplary embodiment according to the invention, in a first position prior to bringing together the upper die and the lower die.

FIG. 1 shows a sectional view through a particularly preferably designed exemplary embodiment according to the invention, in a first position prior to bringing together the upper die and the lower die.

The sintering device 10 comprises a lower die 20 and an upper die 30. The lower die 20 preferably comprises a heating unit 22. Similarly, the upper die 30 may also be provided with a heating unit (not illustrated).

Figure 4:
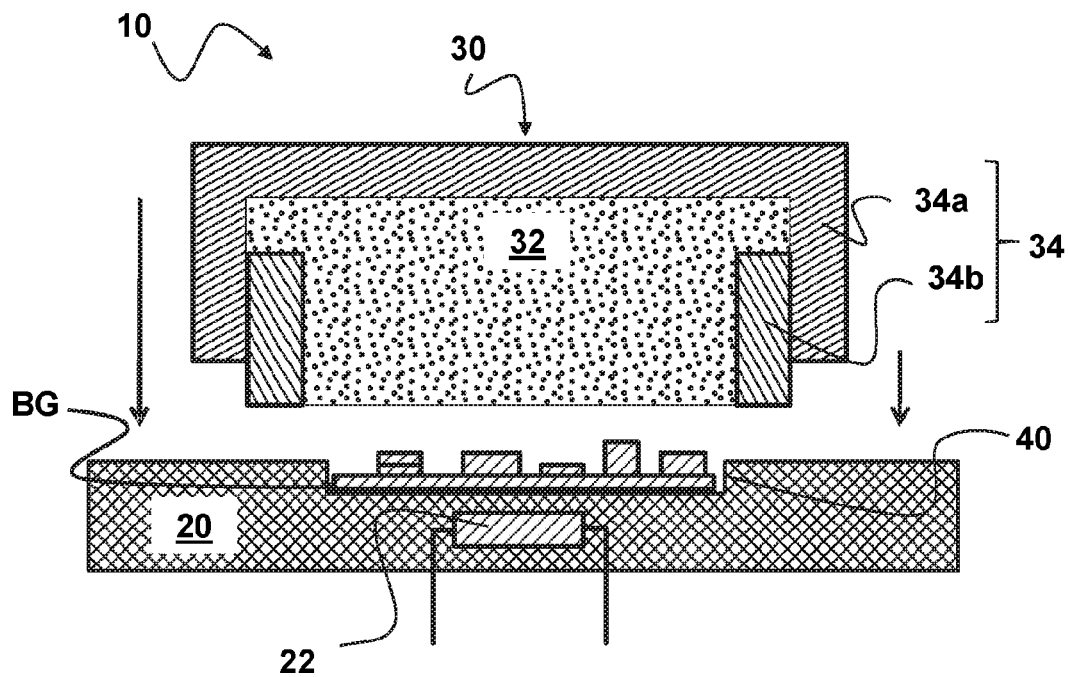
FIG. 4 shows a sectional view through the particularly preferably designed exemplary embodiment according to the invention, showing how the lower die may also comprise a depression.

The lower die 20 forms a support for the electronic assembly BG to be sintered, wherein the support may also have the shape of a depression (40) which is provided in the lower die. Such a depression is illustrated in FIG. 4.

The upper die 30 comprises a receptacle for a pressure pad 32 which is entirely surrounded by a delimitation wall 34. The delimitation wall 34 comprises an outer delimitation wall 34a and an inner delimitation wall 34b which is adjacently disposed to the outer delimitation wall 34a and surrounded thereby, wherein the inner delimitation wall 34b is mounted so as to be slidable towards the outer delimitation wall 34*a* and, when pressure in the direction of the upper die 30 is exerted on the pressure pad 32, is mounted so as to be slid in the direction of the lower die 20.

It is provided here in particular that the volume of the elastic pressure pad 32 terminates in a flush manner with the lower side of the upper die 30. When bringing together the upper die 20 and the lower die 30, the intruding three-dimensional contour of the assembly BG displaces the pressure pad 32 which now pushes the inner delimitation wall 34*b* in the direction of the lower die 20.

The elevated parallel face of the assembly BG must now be larger than the upper face of the inner delimitation wall 34*b* that opposed the lower die 20, in order for an increased force to be generated for sliding. On the other hand, the displaced volume is a measure of the maximum travel of the inner delimitation wall 34*b*.

Since an inner delimitation wall 34*b*, which has been made to fit, typically displays a breakaway torque, the increase in force to overcome the latter has to be at least fivefold. This means that the parallel face of the assembly BG has to be at least five times higher than the upper face of the inner delimitation wall 34*b*.

Figure 2:
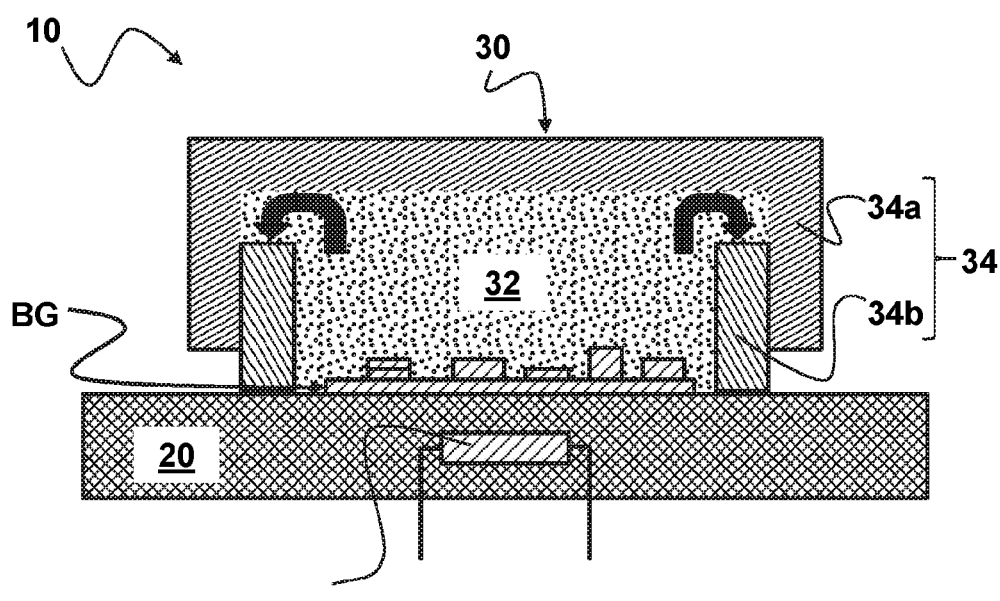
FIG. 2 shows a sectional view through the particularly preferably designed exemplary embodiment according to the invention, in a second position after bringing together the upper die and the lower die.

FIG. 2 shows a sectional view through the exemplary embodiment which is particularly preferably designed, according to the invention, in a second position after bringing together the upper die and the lower die.

During bringing together, the volume of the assembly BG displaces the pressure pad, and the displaced volume slides the inner delimitation wall 34*b* in the direction of the lower die 20. The pressing face of the assembly BG is now larger than the upper face of the inner delimitation wall 34*b*. By way of vertically sliding out the delimitation wall 34*b* in the direction of the lower die 20, lateral deflection of the pressure pad 32 out of the delimitation wall 34 is prevented.

Figure 3:
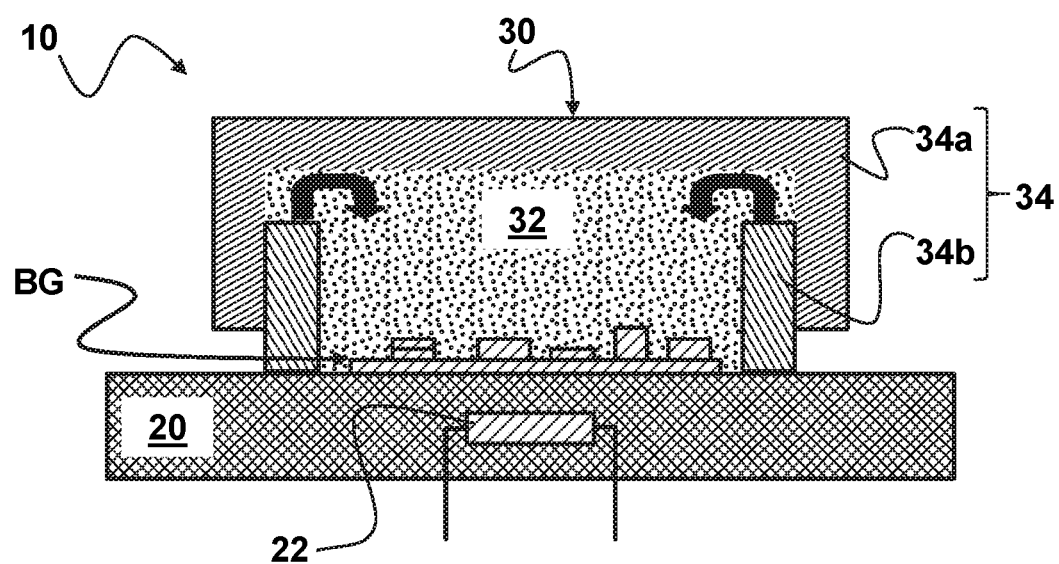
FIG. 3 shows a sectional view through the particularly preferably designed exemplary embodiment according to the invention, in a third position after further bringing together the upper die and the lower die.

When the inner delimitation wall 34*b* is in mechanical contact with the lower die 20, further bringing together of the dies 20, 30 generates a pressure increase in the interior of the receptical of the upper die 30, as illustrated in FIG. 3. The increased pressure is henceforth generated by the horizontal sliding of the inner delimitation wall 34*b* in relation to the upper die 30, wherein a modification of the shape caused thereby of the pressure pad 32 within the delimitation wall 34 generates a sintering pressure on the assembly BG, which is variable within wide ranges.

Incompressibility of the pressure pad leads to hydraulic power transmission. The inner delimitation wall 34*b* is compressed onto the lower die 20 by a force which is greater by multiples and forced in the direction of the upper die 30, and seals, as a result, such that no further flow of the pressure pad 32 may take place.

FIG. 4 shows a sectional view through the particularly preferably designed exemplary embodiment according to the invention, showing how the lower die 20 may also comprise a depression 40 which forms a support for the electronic assembly BG to be sintered.

Figure 5:
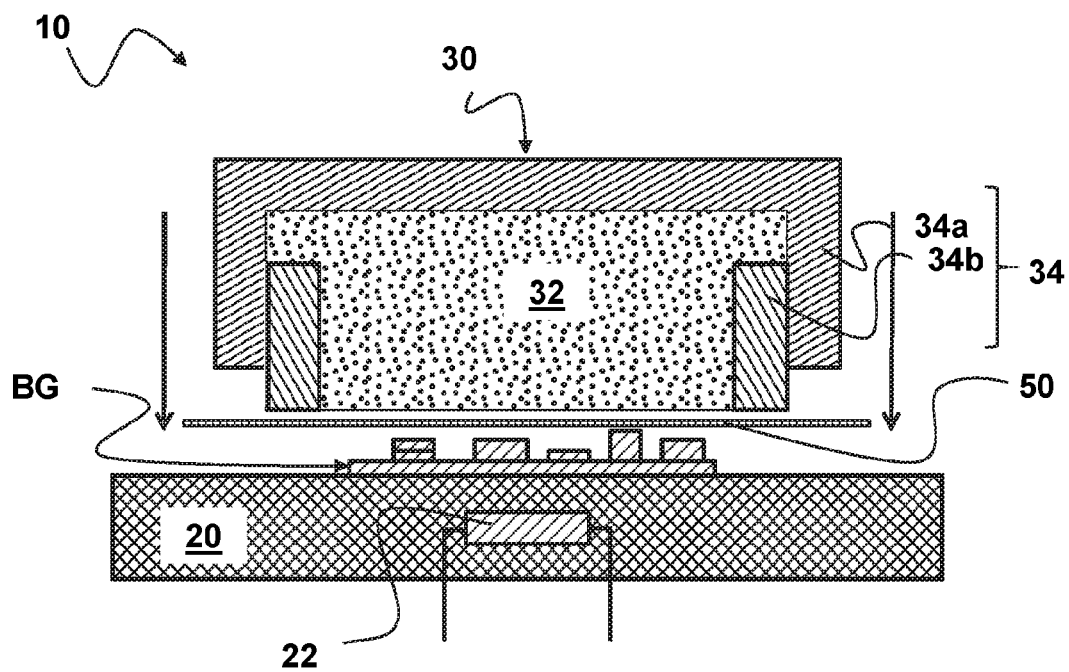
FIG. 5 shows a sectional view through the particularly preferably designed exemplary embodiment according to the invention, illustrating the presence of a protective film.

FIG. 5 shows a sectional view through the particularly preferably designed exemplary embodiment according to the invention, illustrating the presence of a protective film 50. Such a protective film 50 may be advantageously disposed between the assembly BG and the upper die 30. The protective film 50 may preferably be a Teflon film (PTFE film). The protective film 50 separates the assembly from the pressure pad 32 and protects the assembly BG from contamination and adhesion, for example by material abrasion, in particular silicone abrasion of the pressure pad.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A sintering device for sintering at least one electronic assembly, having a lower die and an upper die which is slidable towards the lower die, or a lower die which is slidable towards the upper die, wherein the lower die forms a support for the assembly to be sintered and the upper die comprises a receptacle which receives a pressure pad for exerting pressure directed towards the lower die and which comprises a delimitation wall which laterally surrounds the pressure pad, and wherein the delimitation wall has an outer delimitation wall and an inner delimitation wall which is surrounded in an adjacent manner by the outer delimitation wall, and wherein the inner delimitation wall is mounted so as to be slidable towards the outer delimitation wall and, when pressure in the direction of the upper die is exerted on the pressure pad, is mounted so as to be slid in the direction of the lower die, whereby, following the placing of the inner delimitation wall on the lower die, the pressure pad is displaceable in the direction of the lower die.

2. The sintering device according to claim 1, wherein the pressure pad, in the event of movement of the inner delimitation wall in the direction of the upper die, is adapted as a counter bearing for the inner delimitation wall.

3. The sintering device according to claim 1, wherein the inner delimitation wall protrudes in the direction of the lower die, beyond the outer delimitation wall.

4. The sintering device according to claim 1, wherein the inner delimitation wall is formed from an oxidic, polymer or metallic material.

5. The sintering device according to claim 1, wherein the outer and the inner delimitation walls are configured so as to be annular.

6. The sintering device according to claim 1, wherein the pressure pad is a silicone pad or a rubber pad.

7. The sintering device according to claim 1, wherein the lower die comprises a depression for receiving the assembly to be sintered or a workpiece carrier for a plurality of assemblies.

8. The sintering device according to claim 1, wherein a protective film is disposed between the assembly and the upper die.

9. The sintering device according to claim 2, wherein the inner delimitation wall protrudes in the direction of the lower die, beyond the outer delimitation wall.

10. The sintering device according to claim 2, wherein the inner delimitation wall is formed from an oxidic, polymer or metallic material.

11. The sintering device according to claim 3, wherein the inner delimitation wall is formed from an oxidic, polymer or metallic material.

12. The sintering device according to claim 2, wherein the outer and the inner delimitation walls are configured so as to be annular.

13. The sintering device according to claim 3, wherein the outer and the inner delimitation walls are configured so as to be annular.

14. The sintering device according to claim 4, wherein the outer and the inner delimitation walls are configured so as to be annular.

15. The sintering device according to claim 2, wherein the pressure pad is a silicone pad or a rubber pad.

16. The sintering device according to claim 3, wherein the pressure pad is a silicone pad or a rubber pad.

17. The sintering device according to claim 4, wherein the pressure pad is a silicone pad or a rubber pad.

18. The sintering device according to claim 5, wherein the pressure pad is a silicone pad or a rubber pad.

19. The sintering device according to claim 2, wherein the lower die comprises a depression for receiving the assembly to be sintered or a workpiece carrier for a plurality of assemblies.

20. The sintering device according to claim 3, wherein the lower die comprises a depression for receiving the assembly to be sintered or a workpiece carrier for a plurality of assemblies.

\* \* \* \* \*